United States Patent [19]

Stepan

[11] Patent Number: 4,508,753
[45] Date of Patent: Apr. 2, 1985

[54] METHOD OF PRODUCING FINE LINE CONDUCTIVE/RESISTIVE PATTERNS ON AN INSULATING COATING

[75] Inventor: William E. Stepan, Clarendon Hills, Ill.

[73] Assignee: GTE Automatic Electric Inc., Northlake, Ill.

[21] Appl. No.: 409,672

[22] Filed: Aug. 19, 1982

[51] Int. Cl.³ .............................................. B05D 5/12
[52] U.S. Cl. .................................... 427/53.1; 427/96; 427/264; 427/265; 427/266; 427/275; 427/292; 427/376.3; 427/383.5
[58] Field of Search .................. 427/53.1, 96, 97, 259, 427/264, 265, 266, 275, 292, 376.3, 383.5; 29/846, 851

[56] References Cited

U.S. PATENT DOCUMENTS

| | | | |
|---|---|---|---|
| 3,240,624 | 3/1966 | Beck | 427/96 X |
| 3,392,052 | 7/1968 | Davis | 427/96 |
| 4,020,206 | 4/1977 | Beil | 427/125 X |
| 4,081,653 | 3/1978 | Koo et al. | 427/272 X |
| 4,119,480 | 10/1978 | Nishi et al. | 427/43.1 X |
| 4,191,789 | 5/1980 | Brown | 427/97 |
| 4,270,823 | 6/1981 | Kuznetzoff | 427/357 X |
| 4,336,320 | 6/1982 | Cummings et al. | 430/330 X |

Primary Examiner—Richard Bueker
Attorney, Agent, or Firm—Anthony Miologos; Peter Xiarhos

[57] ABSTRACT

The method of forming fine line circuit patterns on an insulating coating comprising the steps of applying an insulating coating to a substrate, forming a circuit pattern on the insulating coating surface, filling the circuit pattern with conductive or resistive circuit paste, removing the excess and heating at a temperature for sintering the paste to the coating.

12 Claims, 2 Drawing Figures

METHOD OF PRODUCING FINE LINE CONDUCTIVE/RESISTIVE PATTERNS ON AN INSULATING COATING

CROSS REFERENCE TO RELATED APPLICATIONS

This application is related to Applicant's copending U.S. patent applications, titled "Method of Adding Fine Line Conductive/Resistive Patterns to a Thick Film Microcircuit", Ser. No. 409,673, filed Aug. 19, 1982, and "Method of Producing Fine Line Conductive/Resistive Patterns on a Film Substrate", Ser. No. 409,674, filed Aug. 19, 1982, all having a common assignee.

BACKGROUND OF THE INVENTION (1) Field of the Invention

This invention relates in general to the manufacture of thick film microcircuits and more particularly to a method producing fine line conductive/resistive patterns on an electrically insulating coating.

(2) Description of the Prior Art

Thick film microcircuits requiring high density circuit packaging and compatability with integrated circuit leads require circuit patterns with conductive elements as small as 2 mils wide (0.002 inch). The conventional method of screen printing thick film patterns on a film substrate cannot consistently produce patterns with element widths less than 5 to 10 mils. Photolithographic techniques have been used to produce thick film patterns with 2 mil wide conductors, but the process is somewhat complicated and costly.

The conventional method used to produce thick film circuit patterns is to apply conductive and/or resistive "inks" onto a ceramic substrate through a prepared pattern on a wire mesh or stencil. The deposited ink pattern and substrate are "fired" in a furnace to remove the solvents from the paste and sinter the material to the ceramic base. The reproduction of fine images on a screen or stencil is difficult to achieve compounded by the tendency for thick film paste to "slump" or run after it has been printed. These two conditions combine to limit the practical minimal width and spacing of the printed elements on film circuits to 5 to 10 mils.

SUMMARY OF THE INVENTION

The new method for producing fine line conductive/resistive patterns on an electrically insulating coating includes applying the insulating coating on an insulating or non-insulating substrate and stamping, machining or laser engraving the desired fine line pattern on the coating surface. A conductive or resistive paste is spread over the pattern and the excess wiped off. To assure complete removal of the paste from the coating surface a light abrading or lapping can be performed before the firing of the surface.

BRIEF DESCRIPTION OF THE DRAWINGS

A better understanding of the invention can be had from the consideration of the following detailed description taken in conjunction with the accompanying drawings in which.

DESCRIPTION OF THE PREFERRED EMBODIMENT

Figure 1:
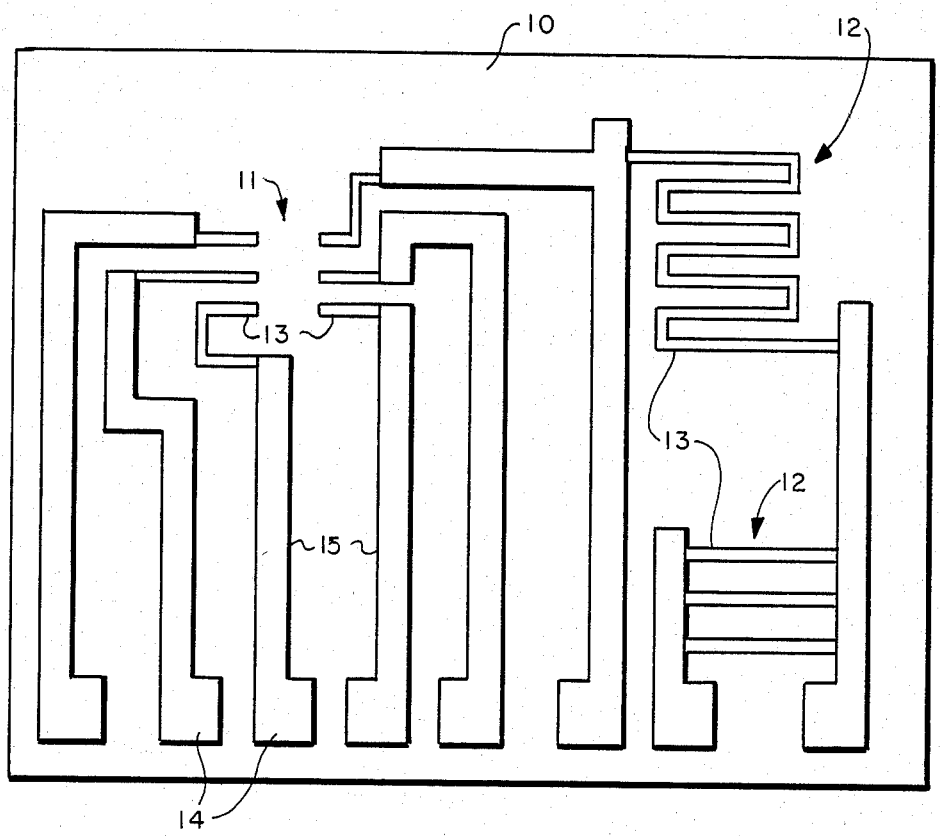
FIG. 1 is a plan view of a microcircuit having in combination conventional thick film and fine line conductive/resistive patterns on an appropriate insulative coating in accordance with the present invention.
Figure 2:
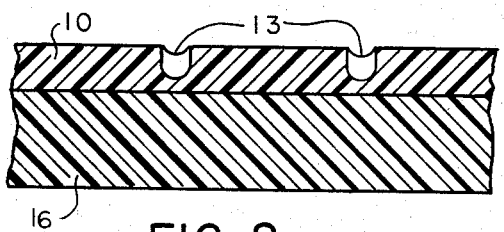
FIG. 2 is a section through the fine line pattern, coating and substrate in accordance with the present invention.

Turning now to FIGS. 1 and 2 of the drawings the method of producing fine line circuit patterns on an insulated surface will be described.

An appropriate insulating coating 10 such as a glass-ceramic composite or the like is bonded to an insulating or non-insulating substrate 16. The fine line conductive or resistive pattern 11 and 12 respectively is formed on the insulating coating by stamping, machining or laser engraving channels 13 forming the pattern on the coating surface. The coating is malleable to a degree where the fine line pattern may be stamped onto the surface with a die or formed in the same manner as grooves are cast onto phonograph records. Additionally, the fine line pattern may be also formed by a laser vaporizing the patterns from the coating or directing a stream of sandblasting particles forming the pattern by mechanical abrasion.

After the pattern has been applied to the coating the appropriate conductor or resistive paste is spread over the surface and allowed to fill the fine line pattern channels 13. It will be appreciated by those skilled in the art that the applied patterns may be of various configurations. For example, in FIG. 1 fine line pattern 11 provides conductive traces to a packaged integrated circuit element and thus channels 13 are filled with an appropriate conductive paste. Fine line pattern 12 forms a resistive network and an appropriate resistive paste would be used to fill the pattern channels.

After the patterns have been filled with the paste the coating surface is wiped clean and a light abrading or lapping of the surace is performed to assure the complete removal of the paste from the surface. The completed circuit is then processed like a conventional screen circuit with the circuit "fired" in a furnace to remove the solvents from the paste and sinter the paste to the coating.

Even though the invention has been described with the insulating coating 10 applied to the substrate 16 and then processed, it would be obvious to those skilled in the art that the fine line pattern may be formed on the insulating coating processed and then applied to the substrate.

Although the best mode contemplated for carrying out the present invention has been herein shown and described it will be apparent that modifications and variations may be made without departing from what is regarded as the subject matter of the invention.

What is claimed is:

1. The method of forming a fine line circuit on an insulating coating comprising the steps of:
   bonding said insulating coating on a substrate surface;
   forming an engraved circuit pattern on a surface of said insulating coating by directing engraving means to remove selected portions of said insulating material;
   applying a circuit medium over said engraved circuit pattern;
   wiping said circuit medium off of said insulating coating surface leaving said engraved circuit pattern filled with said circuit medium; and heating said insulating coating and substrate to cause said circuit medium to be sintered to said insulating coating and establishing said circuit pattern.

2. The method according to claim 1, wherein said circuit medium is an electrically conductive paste, disposed to form electrically conductive circuit patterns.

3. The method according to claim 1, wherein said circuit medium is an electrically resistive paste disposed to form electrically resistive circuit patterns.

4. The method according to claim 1, wherein said engraving means includes directing a laser beam to form said circuit pattern.

5. The method according to claim 1, wherein said engraving means includes directing a die type tool to form said circuit pattern.

6. The method according to claim 1, wherein said engraving means includes directing engraving tools to form said circuit pattern.

7. The method of forming a fine line circuit on an insulating material comprising the steps of:
providing a film of insulating material;
forming an engraved circuit pattern on a surface of said insulating material by directing engraving means to remove selected portions of said insulating material;
applying a circuit medium over said engraved circuit pattern;
wiping said circuit medium off of said insulating material surface leaving said engraved circuit pattern filled with said circuit medium;
heating said insulating material to cause said circuit medium to be sintered to said insulating material and establishing said circuit pattern; and
bonding said insulating material on a substrate surface.

8. The method according to claim 7, wherein said circuit medium is an electrically conductive paste, disposed to form electrically conductive circuit patterns.

9. The method according to claim 7, wherein said circuit medium is an electrically resistive paste disposed to form electrically resistive circuit patterns.

10. The method according to claim 1, wherein said engraving means includes directing a laser beam to form said circuit pattern.

11. The method according to claim 1, wherein said engraving means includes directing a die type tool to form said circuit pattern.

12. The method according to claim 1, wherein said engraving means includes directing engraving tools to form said circuit pattern.

* * * * *